(12) United States Patent
Vashchenko et al.

(10) Patent No.: US 7,387,918 B1
(45) Date of Patent: Jun. 17, 2008

(54) METHOD OF FORMING A SILICON CONTROLLED RECTIFIER STRUCTURE WITH IMPROVED PUNCH THROUGH RESISTANCE

(75) Inventors: Vladislav Vashchenko, Palo Alto, CA (US); Peter J. Hopper, San Jose, CA (US); Ann Concannon, Palo Alto, CA (US); Marcel Ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 27 days.

(21) Appl. No.: 11/411,397

(22) Filed: Apr. 26, 2006

Related U.S. Application Data

(62) Division of application No. 10/649,989, filed on Aug. 27, 2003, now Pat. No. 7,064,397.

(51) Int. Cl.
*H01L 21/332* (2006.01)
(52) U.S. Cl. ................ 438/133; 438/309; 438/400
(58) Field of Classification Search ........ 438/133, 438/309, 400
See application file for complete search history.

(56) References Cited

U.S. PATENT DOCUMENTS

| | | | |
|---|---|---|---|
| 3,502,951 A | 3/1970 | Hunts | 317/235 |
| 4,774,420 A | 9/1988 | Sutton | 307/270 |
| 4,937,647 A * | 6/1990 | Sutton | 257/378 |
| 4,987,465 A | 1/1991 | Longcor et al. | 357/23.13 |
| 5,156,989 A | 10/1992 | Williams et al. | 437/41 |
| 5,485,027 A | 1/1996 | Williams et al. | 257/343 |
| 5,959,332 A | 9/1999 | Ravanelli et al. | 257/360 |
| 6,246,079 B1 | 6/2001 | Chen | 257/173 |
| 6,750,489 B1 | 6/2004 | Merrill | 257/292 |

OTHER PUBLICATIONS

Julian Z. Chen, Ajith Amerasekera and Tom Vrotsos, "Bipolar SCR ESD Protection Circuit For High Speed Submicron Bipolar/ BiCMOS Circuits", IEDM, pp. 337-340, (14.1.1-14.1.4), 1995, IEEE.

\* cited by examiner

*Primary Examiner*—Long Pham
(74) *Attorney, Agent, or Firm*—Mark C. Pickering

(57) ABSTRACT

When a high-voltage, such as from an ESD pulse, is placed across a silicon controlled rectifier, which includes an NPN transistor and a PNP transistor that is connected to the NPN transistor, the likelihood of punch through occurring between two regions of the rectifier is substantially reduced by forming the collector of the NPN transistor between the emitter and collector of the PNP transistor.

20 Claims, 9 Drawing Sheets

METHOD OF FORMING A SILICON CONTROLLED RECTIFIER STRUCTURE WITH IMPROVED PUNCH THROUGH RESISTANCE

RELATED APPLICATIONS

This is a divisional application of application Ser. No. 10/649,989 filed on Aug. 27, 2003, now U.S. Pat. No. 7,064,397 issued on Jun. 20, 2006.

The present application, U.S. Pat. No. 6,919,588, which issued on Jul. 19, 2005, and application Ser. No. 11/134,911, which was filed on May 23, 2005, now U.S. Pat. No. 7,238,553, which issued on Jul. 3, 2007, have related subject matter.

DETAILED DESCRIPTION OF THE INVENTION

Figure 1:
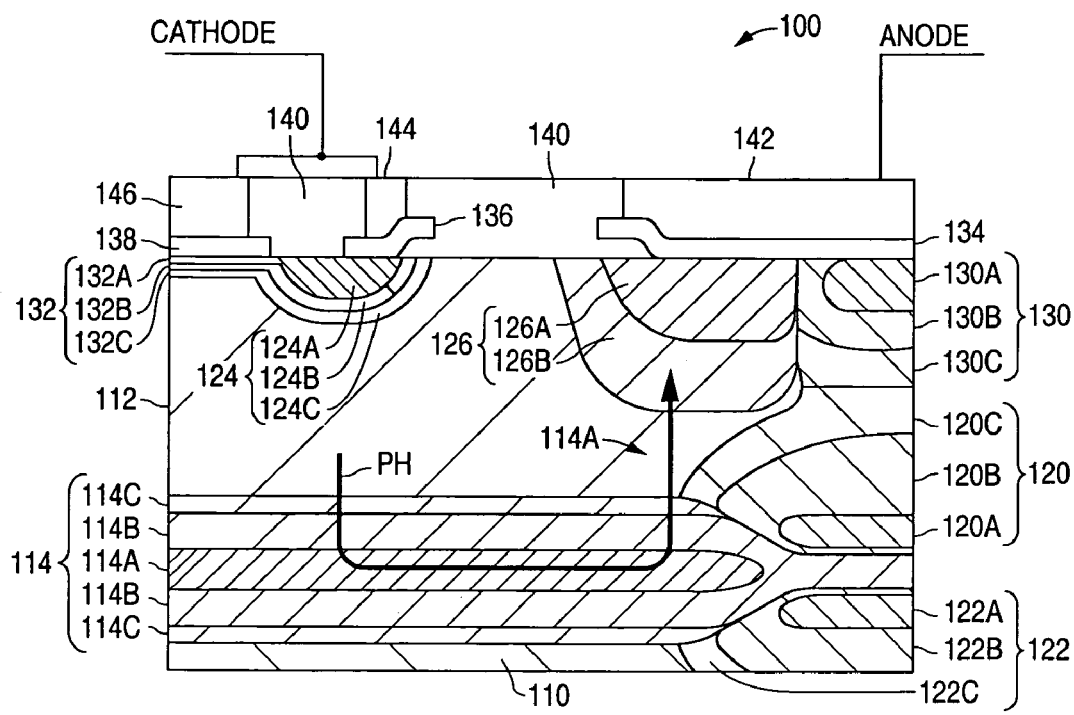
FIG. 1 is a cross-sectional view illustrating an example of a silicon controlled rectifier (SCR) structure 100 in accordance with the present invention.

FIG. 1 shows a cross-sectional view that illustrates an example of a silicon controlled rectifier (SCR) structure 100 in accordance with the present invention. As described in greater detail below, SCR structure 100, which can be used to provide electro-static discharge (ESD) protection, reduces the likelihood of punch-through when a high voltage is placed across two highly-doped regions by forming a highly-doped region of the opposite conductivity type partially between the two highly doped regions.

As shown in FIG. 1, SCR structure 100 includes a p-type substrate 110 and an n-type epitaxial layer 112 that is formed on substrate 110. SCR structure 100 is a high-voltage device which, when compared to a conventional low-voltage bipolar device, has a substantially thicker epitaxial layer. For example, epitaxial layer 112 can be approximately 15-17 um thick.

In addition, SCR structure 100 includes an n-type buried layer (NBL) 114 that is formed in the top surface of substrate 110. As shown in FIG. 1, buried layer 114 includes a center region 114A, a first outer region 114B that adjoins center region 114A, and a second outer region 114C that adjoins first outer region 114B.

Center region 114A has a first dopant concentration of, for example, $1\times10^{20}$ (n+), while first outer region 114B has a second dopant concentration of, for example, $1\times10^{19}$. Second outer region 114C has a third dopant concentration of, for example, $1\times10^{18}$, while epitaxial layer 112 has a fourth dopant concentration of, for example, $1\times10^{15}$. The first and second outer regions 114B and 114C represent the diffusion tails of center region 114A.

SCR structure 100 also includes a p-type region 120 that is formed in the top surface of substrate 110 and the bottom surface of epitaxial layer 112. P-type region 120, which is isolated from substrate 110 by buried layer 114, includes a center region 120A that lies vertically closer to the top surface of substrate 110 than center region 114A, a first outer region 120B that adjoins center region 120A, and a second outer region 120C that adjoins first outer region 120B.

Center region 120A has a fifth dopant concentration of, for example $1\times10^{20}$ (p+), while first outer region 120B has a sixth dopant concentration of, for example, $1\times10^{19}$. Second outer region 120C has a seventh dopant concentration of, for example, $1\times10^{18}$, while substrate 110 has an eighth dopant concentration of, for example, $1\times10^{15}$. The first and second outer regions 120B and 120C represent the diffusion tails of center region 120A.

Further, SCR structure 100 includes a p-type region 122 that is formed in the top surface of substrate 110 vertically below, and spaced apart from, p-type region 120. P-type region 122 includes a center region 122A that is vertically further away from the top surface of substrate 110 than center region 114A, a first outer region 122B that adjoins center region 122A, and a second outer region 122C that adjoins first outer region 122B.

Center region 122A has the fifth dopant concentration, while first outer region 122B has the sixth dopant and second outer region 122C has the seventh dopant concentration. The first and second outer regions 122B and 122C represent the diffusion tails of center region 122A.

SCR structure 100 additionally includes a p-type region 124 that is formed in the top surface of epitaxial layer 112. P-type region 124 has a center region 124A, a first outer region 124B that adjoins center region 124A, and a second outer region 124C that adjoins first outer region 124B.

Center region 124A has the fifth dopant concentration, while first outer region 124B has the sixth dopant concentration and second outer region 124C has the seventh dopant concentration. The first and second outer regions 124B and 124C represent the diffusion tails of center region 124A.

SCR structure 100 further includes an n-type sinker down region 126 that is formed in the top surface of epitaxial layer 112. Sinker down region 126, which is spaced apart from p-type region 124, includes a center region 126A and an outer region 126B that adjoins center region 126A. Center region 126A has the second dopant concentration, while outer region 126B has the third dopant concentration. Outer region 126B represents the diffusion tail of center region 126A.

In addition, SCR structure 100 also includes a p-type region 130 that is formed in epitaxial layer 112. P-type region 130, which contacts p-type region 120 and sinker down region 126, includes a center region 130A, a first outer region 130B that adjoins center region 130A, and a second outer region 130C that adjoins first outer region 130B.

Center region 130A has the fifth dopant concentration, while first outer region 130B has the sixth dopant concentration and second outer region 130C has the seventh dopant concentration. The first and second outer regions 130B and 130C represent the diffusion tails of center region 130A.

Further, n-type sinker down region 126 is spaced apart from n-type buried layer 114 by a region 114A of n-type epitaxial layer 112 that adjoins the pn junction between p-type regions 120/130 and epitaxial layer 112. Thus, buried layer 114, region 114A of epitaxial layer 112, and sinker down region 126 provide a current path PH that includes low resistance sections provided by buried layer 114 and sinker down region 126, and a short high resistance section provided by region 114A of epitaxial layer 112.

As further shown in FIG. 1, SCR structure 100 includes a p-type region 132 that is formed in epitaxial layer 112. P-type region 132, which contacts p-type region 124, includes a center region 132A that contacts center region 124A, a first outer region 132B that adjoins center region 132A and contacts first outer region 124B, and a second outer region 132C that adjoins first outer region 132B and contacts second outer region 124C.

Center region 132A has the fifth dopant concentration, while first outer region 132B has the sixth dopant concentration and second outer region 132C has the seventh dopant concentration. The first and second outer regions 132B and 132C represent the diffusion tails of center region 132A.

In addition, SCR structure 100 includes a polysilicon region 134 that is formed on epitaxial layer 112. Polysilicon region 134 includes an n+ region that is formed over sinker down region 126, and a p+ region that is formed over p-type region 130. SCR structure 100 also includes a p+ polysilicon region 136 that is formed on epitaxial layer 112 over p-type region 124, and an n+ polysilicon region 138 that is formed on epitaxial layer 112 over p-type region 132. (Autodoping from polysilicon region 138 can form an n+ region in epitaxial layer 112 directly under polysilicon region 138 between polysilicon region 138 and p+ region 132A.) Polysilicon regions 134, 136, and 138 are spaced apart from each other.

SCR structure 100 additionally includes a layer of isolation material 140 that is formed over epitaxial layer 112, and a first contact structure 142 that is formed through isolation layer 140 to make an electrical connection with polysilicon region 134. First contact structure 142, polysilicon region 134, n-type sinker down region 126, and p-type region 130 can function as the anode of an ESD diode structure (where the anode is connected to a to-be-protected pad).

Further, SCR structure 100 includes a second contact structure 144 that is formed through isolation layer 140 to make an electrical connection with polysilicon region 136, and a third contact structure 146 that is formed through isolation layer 140 to make an electrical connection with polysilicon region 138. Second contact structure 144 and third contact structure 146 can be electrically connected together to function, along with polysilicon regions 136 and 138 and p-type regions 124 and 132 as the cathode of the ESD diode structure (where the cathode is connected to ground).

SCR structure 100 forms a NPN bipolar transistor that utilizes n+ polysilicon region 138 as the emitter, p-type regions 124 and 132 as the base, and epitaxial layer 112, buried layer 114, and sinker down region 126 as the collector. SCR structure 100 also forms a PNP transistor that utilizes p-type regions 120/130 as the emitter, epitaxial layer 112, buried layer 114, and sinker down region 126 as the base, and p-type regions 124 and 132 as the collector.

In operation, when a voltage on the anode of SCR structure 100 rises with respect to the voltage on the cathode, the voltage on n-type sinker down region 126 and epitaxial layer 112 rises with respect to the voltage on p-type regions 124 and 132, thereby reverse biasing the pn junction between p-type regions 124 and 132, and n-type epitaxial layer 112. As a result, SCR structure 100 blocks a current, other than a leakage current, from flowing from the anode to the cathode until the anode-to-cathode voltage exceeds a breakdown voltage.

When the rising voltage on the anode exceeds the breakdown voltage, avalanche multiplication causes large numbers of electrons to be injected into n-type epitaxial layer 112 and large numbers of holes to be injected into p-type regions 124 and 132. The electrons injected into epitaxial layer 112 follow the current path PH provided by buried layer 114, region 114A of epitaxial layer 112, and sinker down region 126.

The short high resistance section 114A of the current path PH due to epitaxial layer 112 provides a voltage drop at the pn junction between p-type regions 120/130 and epitaxial layer 112 which, in turn, forward biases the pn junction between p-type regions 120/130 and epitaxial layer 112, thereby allowing p-type regions 120/130 to inject holes into epitaxial layer 112.

In addition, the holes injected into p-type regions 124 and 132 forward bias the pn junction between p-type regions 124 and 132, and n+ polysilicion region 138 due to the resistance associated with n+ polysilicon region 138. When forward biased, n+ polysilicon region 138 injects electrons into p-type regions 124 and 132.

Further, the accumulation of positive charge in p-type regions 124 and 132, and the accumulation of negative charge in epitaxial layer 112 due to the injection of large numbers of holes and electrons, respectively, reduces the magnitude of the reversed biased junction until the pn junction between p-type regions 124 and 132, and n-type epitaxial layer 112 switches and becomes forward biased. Once the pn junction between p-type regions 124 and 132 and n-type epitaxial layer 112 becomes forward biased, a large current flows from the anode to the cathode, while the anode-to-cathode voltage drops to a holding voltage that is substantially lower than the breakdown voltage.

Figure 2:
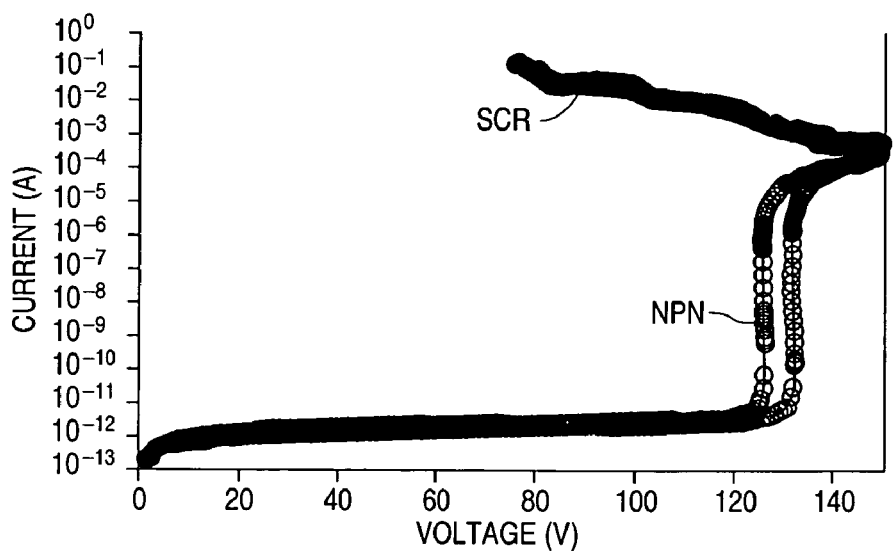
FIG. 2 is a graph illustrating a comparison between the operation of SCR structure 100 and a reference NPN transistor in accordance with the present invention.

FIG. 2 shows a graph that illustrates a comparison between the operation of SCR structure 100 and a reference NPN transistor in accordance with the present invention. The reference NPN transistor is similar to SCR structure 100, except that p-type regions 120, 122, and 130 are excluded.

As shown in FIG. 2, SCR structure 100 and the NPN transistor both block substantially all of the current until the voltage rises to a breakdown voltage of approximately 125V for the NPN transistor, and a breakdown voltage of approximately 130V for SCR structure 100. Once the breakdown voltages have been exceeded, SCR structure 100 and the reference NPN transistor turn on and conduct a large current. Thus, with the exception of a slightly higher breakdown voltage, SCR structure 100 operates substantially the same as the reference NPN transistor.

One of the advantages of the present invention is that since sinker down region 126 is located partially between p-type region 124 and p-type regions 120/130, the present invention substantially reduces the likelihood that p-type regions 120/130 will punch through to p-type region 124 under high-voltage conditions, e.g., 125V.

When a high-voltage SCR structure includes two highly doped regions that are formed in a lightly-doped material of the opposite conductivity type, punch through can occur at voltages that are substantially lower than the breakdown voltage such as, for example, 40V versus 125V. By increasing the dopant concentration between the p-type regions 124 and 120/130 via sinker down region 126, a voltage which is larger than the breakdown voltage is required to initiate punch through.

Another advantage is that the present invention provides control over dV/dt triggering. When the voltage on the anode increases gradually, the depletion region of the pn junction between p-type regions 124 and 132, and n-type epitaxial layer 112 also increases gradually. The change in the size of the depletion region removes electrons from epitaxial layer 112 and holes from p-type regions 124 and 132. The gradual increase, however, does not cause large number of charge carriers to move at one time.

On the other hand, when the voltage on the anode changes quickly, the depletion region also changes quickly. The quick change in the size of the depletion region can cause a large number of electrons to flow to the junction between epitaxial layer 112 and p-type regions 120/130, and a large number of holes to flow to the junction between p-type regions 124 and 132 and n+ polysilicon region 138. Although this is a transitory condition, the flow of electrons and holes can trigger a SCR structure to turn on.

In the present invention, dV/dt triggering can be controlled by varying the position of p-type region 120 with respect to p-type region 124. Thus, dV/dt triggering occurs at one voltage when the junction between epitaxial layer 112 and p-type region 120 is closer to p-type region 124, and at another voltage when the junction between epitaxial layer 112 and p-type region 120 is further away from p-type region 124.

Figure 3:
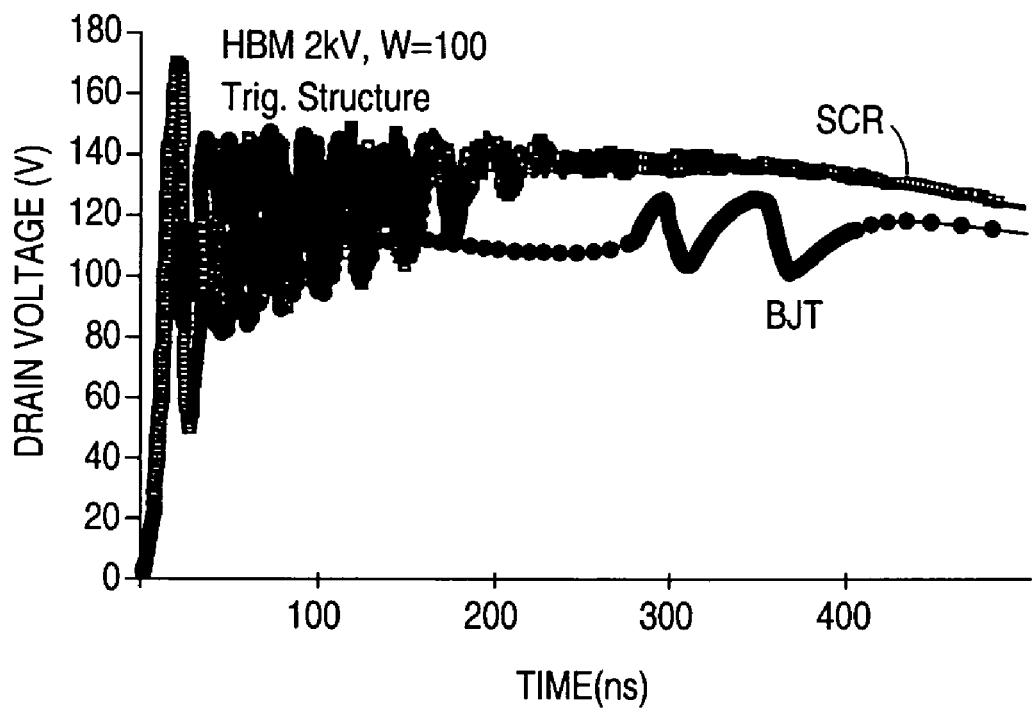
FIG. 3 is a graph further illustrating a comparison between the operation of SCR structure 100 and the reference NPN transistor in accordance with the present invention.

FIG. 3 shows a graph that further illustrates a comparison between the operation of SCR structure 100 and the reference NPN transistor in accordance with the present invention. As shown in FIG. 3, where the drain voltage is shown over time following an ESD event, SCR structure 100 has a drain voltage that is slightly higher than the reference NPN transistor following the onset of the ESD event.

Figure 4:
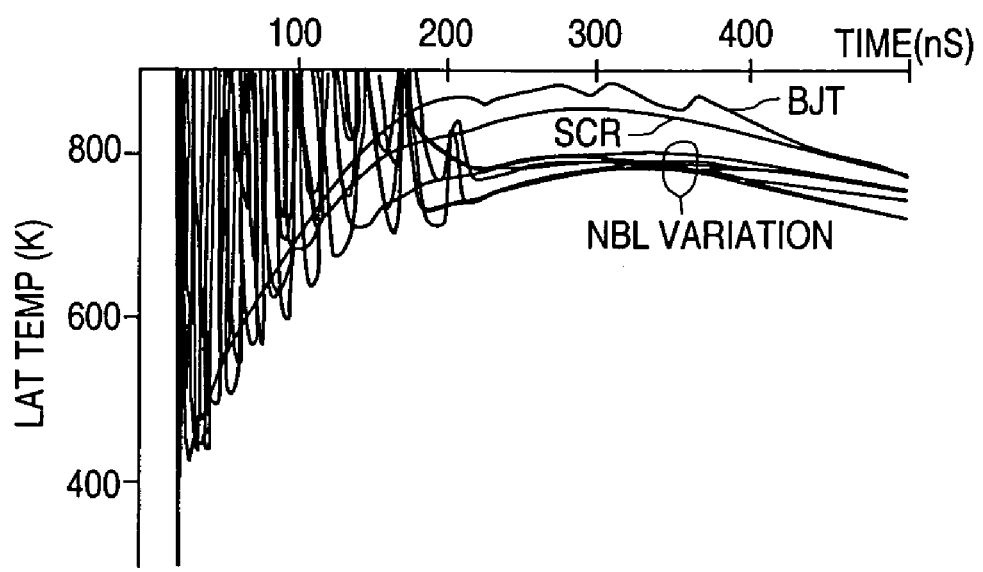
FIG. 4 is a graph additionally illustrating a comparison between the operation of SCR structure 100 and the reference NPN transistor in accordance with the present invention.

FIG. 4 shows a graph that additionally illustrates a comparison between the operation of SCR structure 100 and the reference NPN transistor in accordance with the present invention. As shown in FIG. 4, where the lattice temperature is shown over time following an ESD event (lattice temperature can be used as a figure of merit for comparative analysis), SCR structure 100 has a lower lattice temperature following the onset of the ESD event. (In addition, FIG. 4 also shows that lower lattice temperatures can be obtained by varying the thickness (vertical) and length (horizontal) of buried layer (NBL) 114.)

Figure 5:
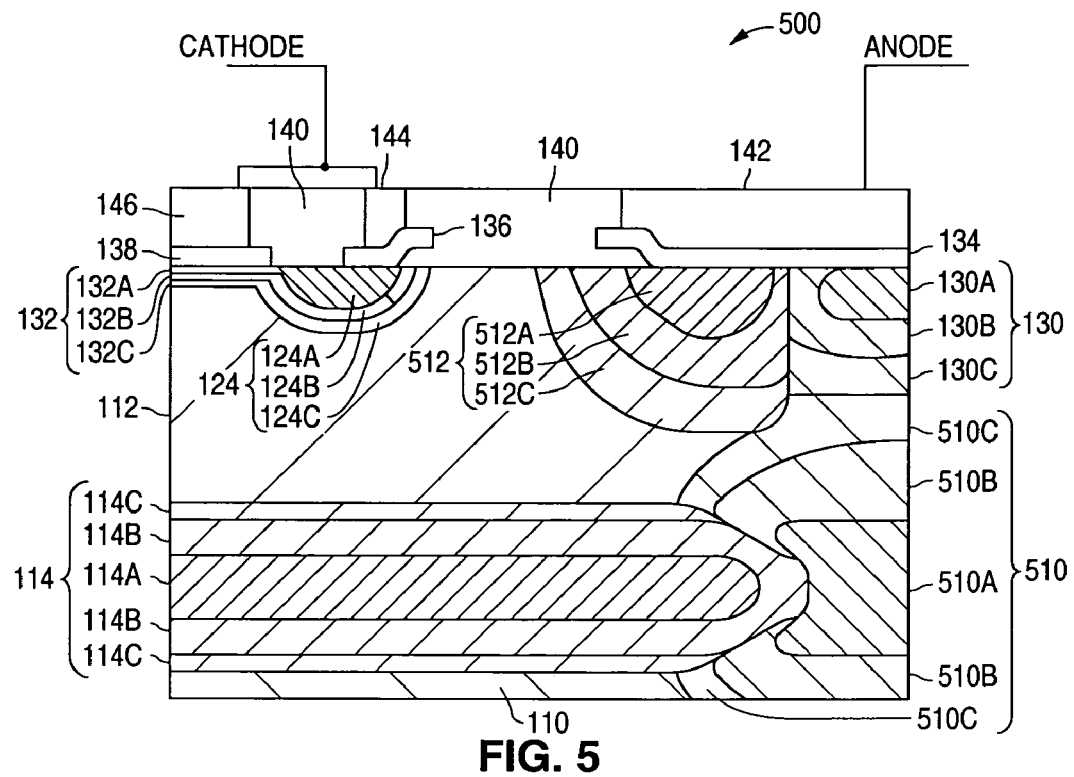
FIG. 5 is a cross-sectional view illustrating an example of a silicon controlled rectifier (SCR) structure 500 in accordance with an alternate embodiment of the present invention.

FIG. 5 shows a cross-sectional view that illustrates an example of a silicon controlled rectifier (SCR) structure 500 in accordance with an alternate embodiment of the present invention. SCR structure 500 is similar to SCR structure 100 and, as a result, utilizes the same reference numerals to designate the structures which are common to both structures.

As shown in FIG. 5, SCR structure 500 differs from SCR structure 100 in that structure 500 uses a single p-type region 510 in lieu of p-type regions 120 and 122. P-type region 510 provides a path for injection current through buried layer 114, unlike p-type region 120 of SCR structure 100 which is isolated from substrate 110 by buried layer 114.

P-type region 510 includes a center region 510A that lies in the same horizontal plane as center region 114A, a first outer region 510B that adjoins center region 510A, and a second outer region 510C that adjoins first outer region 510B. Center region 510A has the fifth dopant concentration, while first outer region 510B has the sixth dopant and second outer region 510C has the seventh dopant concentration.

SCR structure 500 also differs by including an n-type sinker down region 512 with two dopant tails rather than one. Sinker down region 512 includes a center region 512A, a first outer region 512B that adjoins center region 512A, and a second outer region 512C that adjoins outer region 512B.

Center region 512A has the first dopant concentration, while first outer region 512B has the second dopant concentration and second outer region 512C has the third dopant concentration. In addition, center region 114A in structure 500 is thicker than center region 114A in structure 100.

Figure 6:
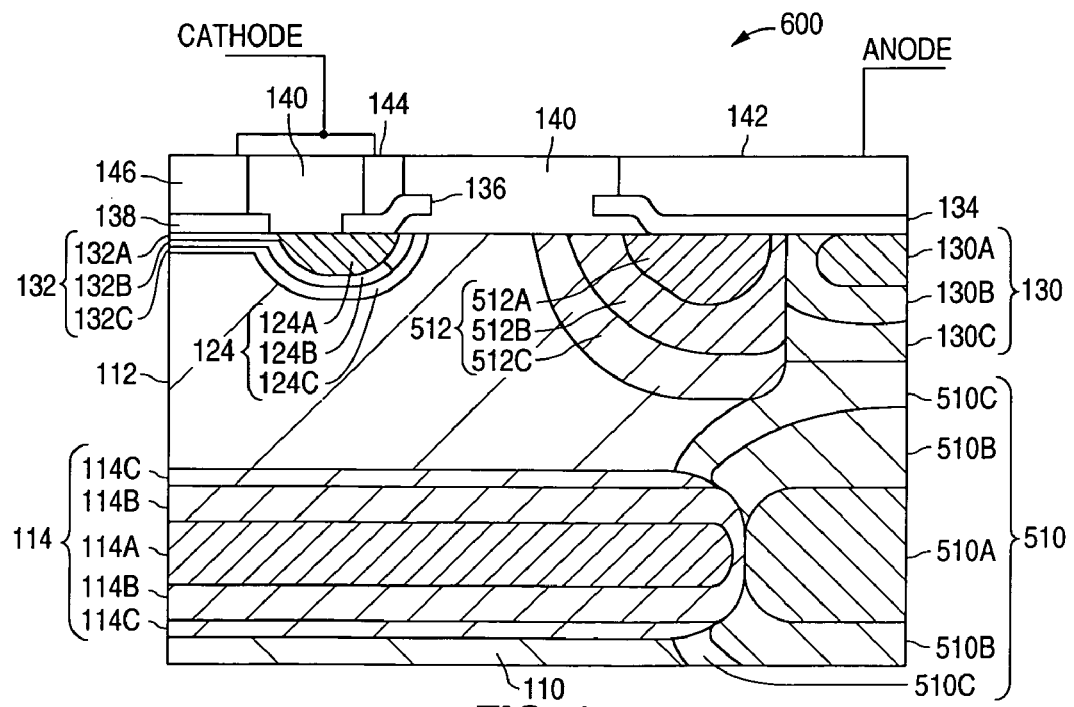
FIG. 6 is a cross-sectional view illustrating an example of a silicon controlled rectifier (SCR) structure 600 in accordance with a second alternate embodiment of the present invention.

FIG. 6 shows a cross-sectional view that illustrates an example of a silicon controlled rectifier (SCR) structure 600 in accordance with a second alternate embodiment of the present invention. SCR structure 600 is similar to SCR structure 500 and, as a result, utilizes the same reference numerals to designate the structures which are common to both structures.

As shown in FIG. 6, SCR structure 600 differs from SCR structure 500 in that p-type region 510 of structure 600 is larger than p-type region 510 of structure 500. In addition, buried layer 114 of SCR structure 600 is horizontally shorter than buried layer 114 of SCR structure 500.

Figure 7:
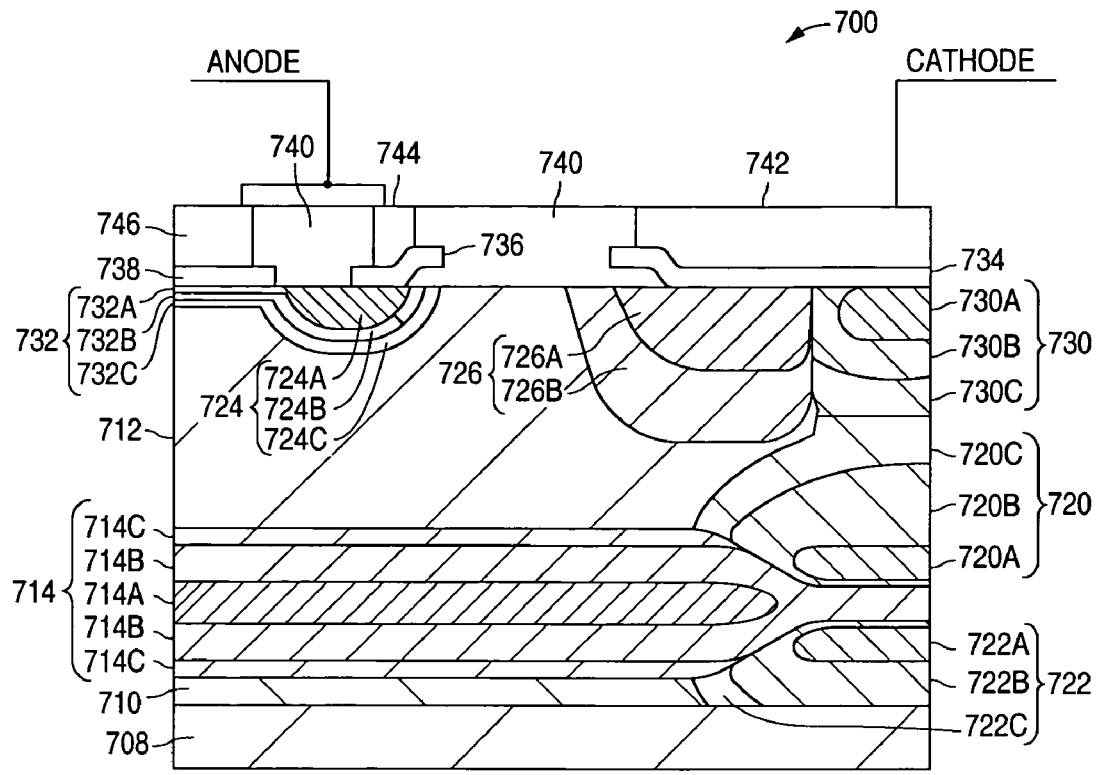
FIG. 7 is a cross-sectional view illustrating an example of a silicon controlled rectifier (SCR) structure 700 with opposite conductivity types in accordance with the present invention.

In addition to SCR structures 100, 500, and 600, the present invention includes SCR structures that utilize the opposite conductivity types. FIG. 7 shows a cross-sectional view that illustrates an example of a silicon controlled rectifier (SCR) structure 700 with opposite conductivity types in accordance with the present invention.

As shown in FIG. 7, SCR structure 700 includes a p-type substrate 708, an n-type epitaxial layer 710 that is formed on substrate 708, and a p-type well 712 that is formed in epitaxial layer 710. In addition, SCR structure 700 includes a p-type buried layer 714 that is formed in well 712. Buried layer 714 includes a center region 714A, a first outer region 714B that adjoins center region 714A, and a second outer region 714C that adjoins first outer region 714B.

Center region 714A has the fifth dopant concentration, while first outer region 714B has the sixth dopant concentration. Second outer region 714C has the seventh dopant concentration, while well 712 has the eighth dopant concentration. The first and second outer regions 714B and 714C represent the diffusion tails of center region 714A.

SCR structure 700 additionally includes an n-type region 720 that is formed in well 712. N-type region 720, which is isolated from epitaxial layer 710 by buried layer 714, includes a center region 720A that lies vertically closer to the top surface of well 712 than center region 714A, a first outer region 720B that adjoins center region 720A, and a second outer region 720C that adjoins first outer region 720B.

Center region 720A has the first dopant concentration, while first outer region 720B has the second dopant concentration, second outer region 720C has the third dopant concentration, and epitaxial layer 710 has the fourth dopant concentration. The first and second outer regions 720B and 720C represent the diffusion tails of center region 720A.

Further, SCR structure 700 includes an n-type region 722 that is formed in well 712 vertically below, and spaced apart from, n-type region 720. N-type region 722 includes a center region 722A that is vertically further away from the top surface of well 712 than center region 714A, a first outer region 722B that adjoins center region 722A, and a second outer region 722C that adjoins first outer region 722B. Center region 722A has the first dopant concentration, while first outer region 722B has the second dopant and second outer region 722C has the third dopant concentration. The first and second outer regions 722B and 722C represent the diffusion tails of center region 722A.

SCR structure 700 additionally includes an n-type region 724 that is formed in the top surface of p-well 712. N-type region 724 has a center region 724A, a first outer region 724B that adjoins center region 724A, and a second outer region 724C that adjoins first outer region 724B.

Center region 724A has the first dopant concentration, while first outer region 724B has the second dopant concentration and second outer region 724C has the third dopant concentration. The first and second outer regions 724B and 724C represent the diffusion tails of center region 724A.

SCR structure 700 further includes a p-type sinker down region 726 that is formed in the top surface of p-well 712. Sinker down region 726, which spaced apart from n-type region 724, includes a center region 726A and an outer region 726B that adjoins center region 726A. Center region 726A has the second dopant concentration, while outer region 726B has the third dopant concentration. Outer region 726B represents the diffusion tail of center region 726A.

In addition, SCR structure 700 also includes an n-type region 730 that is formed in p-well 712. N-type region 730, which contacts n-type region 720 and sinker down region 726, includes a center region 730A, a first outer region 730B that adjoins center region 730A, and a second outer region 730C that adjoins first outer region 730B.

Center region 730A has the first dopant concentration, while first outer region 730B has the second dopant concentration and second outer region 730C has the third dopant concentration. The first and second outer regions 730B and 730C represent the diffusion tails of center region 730A.

As further shown in FIG. 7, SCR structure 700 includes an n-type region 732 that is formed in p-well 712. N-type region 732, which contacts n-type region 724, includes a center region 732A that contacts center region 724A, a first outer region 732B that adjoins center region 732A and contacts first outer region 724B, and a second outer region 732C that adjoins first outer region 732B and contacts second outer region 724C.

Center region 732A has the fifth dopant concentration, while first outer region 732B has the sixth dopant concentration and second outer region 732C has the seventh dopant concentration. The first and second outer regions 732B and 732C represent the diffusion tails of center region 732A.

In addition, SCR structure 700 includes a polysilicon region 734 that is formed on p-well 712. Polysilicon layer 734 includes a p+ region that is formed on sinker down region 726 and an n+ region that is formed on n-type region 730. SCR structure 700 also includes an n+ polysilicon region 736 that is formed on p-well 712 over n-type region 724, and a p+ polysilicon region 738 that is formed on p-well 712 over n-type region 732. Polysilicon regions 734, 736, and 738 are spaced apart from each other.

SCR structure 700 additionally includes a layer of isolation material 740 that is formed over p-well 712, and a first contact structure 742 that is formed through isolation layer 740 to make an electrical connection with polysilicon region 734. First contact structure 742, polysilicon region 734, p-type sinker down region 726, and n-type region 730 can function as the cathode of an ESD diode structure.

Further, SCR structure 700 includes a second contact structure 744 that is formed through isolation layer 740 to make an electrical connection with polysilicon region 736, and a third contact structure 746 that is formed through isolation layer 740 to make an electrical connection with polysilicon region 738. Second contact structure 744 and third contact structure 746 can be electrically connected together to function, along with polysilicon regions 736 and 738 and n-type regions 724 and 732 as the anode of the ESD diode structure.

SCR structure 700 forms a PNP bipolar transistor that utilizes n+ polysilicon region 738 as the emitter, n-type regions 724 and 732 as the base, and p-well 712, buried layer 714, and sinker down region 726 as the collector. SCR structure 700 also forms a NPN transistor that utilizes n-type regions 720/730 as the emitter, p-well 712, buried layer 714, and sinker down region 726 as the base, and n-type regions 724 and 732 as the collector.

Figure 8A:
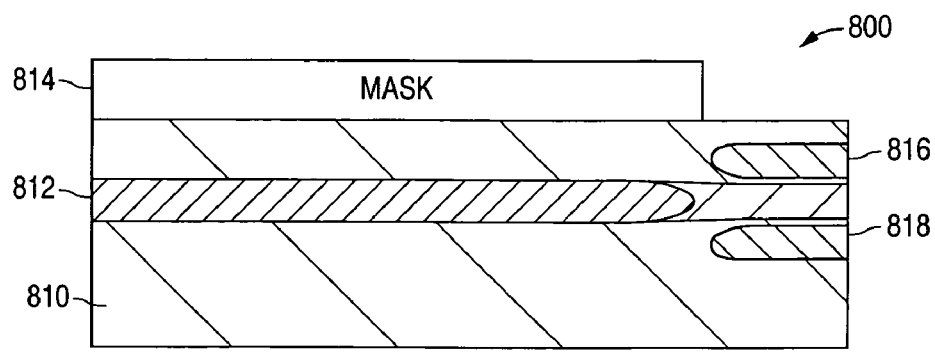
FIGS. 8A-8J are a series of cross-sectional diagrams illustrating an example of a method of forming a silicon controlled rectifier in accordance with the present invention.

FIGS. 8A-8J show a series of cross-sectional diagrams that illustrate an example of a method of forming a silicon controlled rectifier in accordance with the present invention. As shown in FIG. 8A, the method begins by implanting a substrate 810 with an n-type dopant to form an n+ buried layer 812 in substrate 810. (A mask can be used to limit the locations of n+ buried layer 812 in substrate 810.)

After n+ buried layer has been formed, an implant mask 814 is formed and patterned on the top surface of substrate 810. The exposed areas of substrate 810 are then implanted to form a p+ sinker up region 816 and a p+ region 818 in the top surface of substrate 810. (The implanted material reduces the concentration of buried layer 812.) Implant mask 814 is then removed.

Figure 8B:
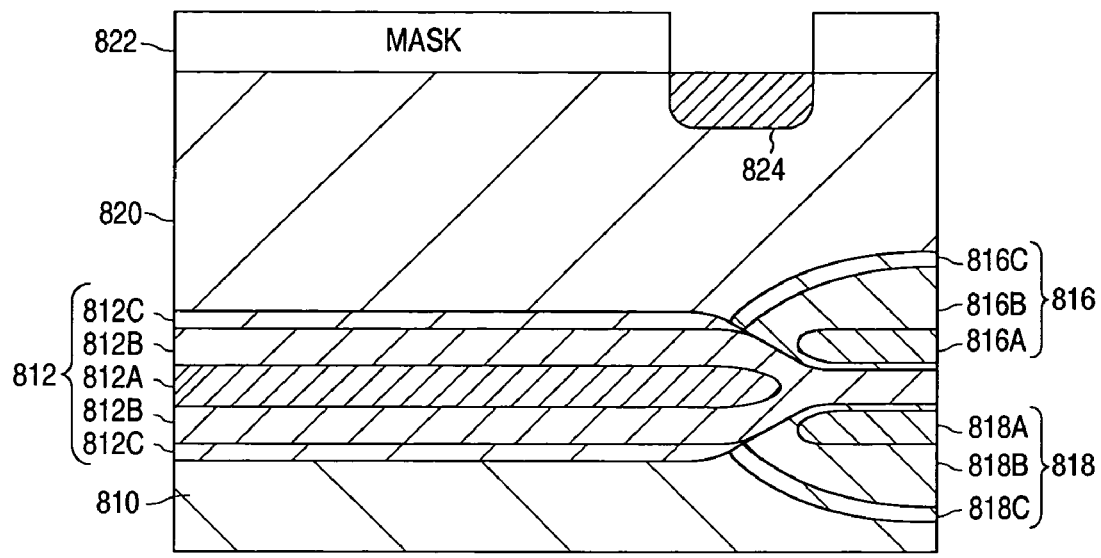

Next, as shown in FIG. 8B, an n-type epitaxial layer 820 is grown on the top surface of substrate 810. The epitaxial growth step causes the dopants in n+ buried layer 812 to diffuse and form a center region 812A, a first outer region 812B that adjoins center region 812A, and a second outer region 812C that adjoins first outer region 812B.

Center region 812A has the first dopant concentration, while first outer region 812B has the second dopant concentration and second outer region 812C has the third dopant concentration. The first and second outer regions 812B and 812C represent the diffusion tails of center region 812A.

The epitaxial growth step also causes the dopants in p+ sinker up region 816 to diffuse and form a center region 816A, a first outer region 816B that adjoins center region 816A, and a second outer region 816C that adjoins first outer region 816B. Center region 816A has the fifth dopant concentration, while first outer region 816B has the sixth dopant concentration and second outer region 816C has the seventh dopant concentration. The first and second outer regions 816B and 816C represent the diffusion tails of center region 816A.

The epitaxial growth step additionally causes the dopants in p+ region 818 to diffuse and form a center region 818A, a first outer region 818B that adjoins center region 818A, and a second outer region 818C that adjoins first outer region 818B. Center region 818A has the fifth dopant concentration, while first outer region 818B has the sixth dopant concentration and second outer region 818C has the seventh dopant concentration. The first and second outer regions 818B and 818C represent the diffusion tails of center region 818A.

In accordance with the present invention, epitaxial layer 820 is grown without implanting substrate 810 to form an n-type sinker up region that lies over buried layer 812. Following the growth of epitaxial layer 820, an implant mask 822 is formed and patterned on the top surface of epitaxial layer 820. Once mask 822 has been formed, the exposed regions of epitaxial layer 820 are implanted with an n-type dopant to form an n+ sinker down region 824. Following this, mask 822 is removed.

Figure 8C:
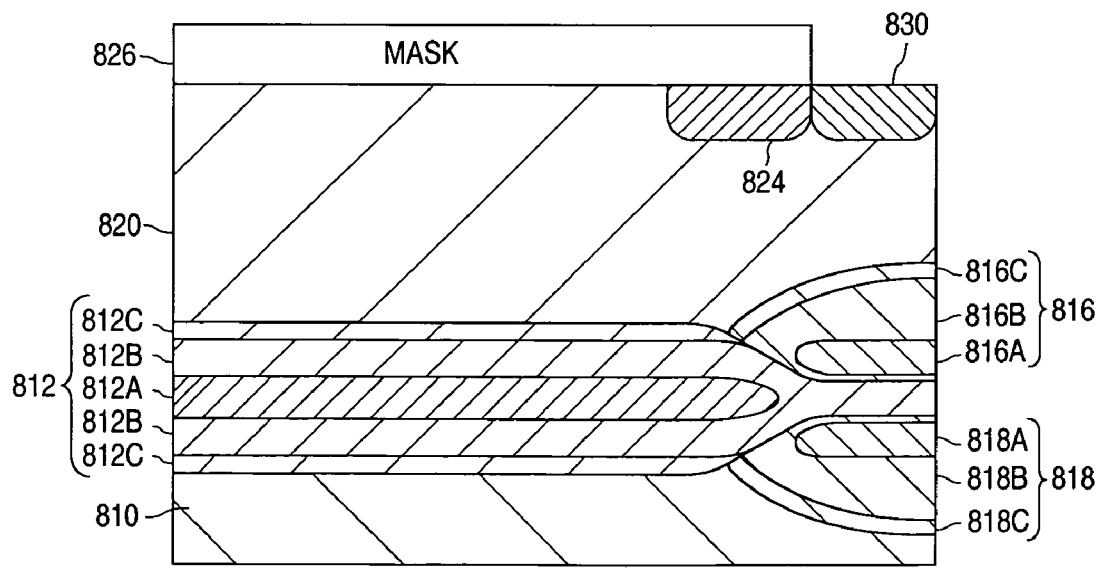

After mask 822 has been removed, as shown in FIG. 8C, an implant mask 826 is formed and patterned on the top surface of epitaxial layer 820. In accordance with the present invention, the exposed regions of epitaxial layer 820 are then implanted with a p-type dopant to form a p+ sinker down region 830. In the example shown in FIG. 8C, p+ sinker down region 830 adjoins n+ sinker down region 824, although p+ sinker down region 830 need only be within close proximity of n+ sinker down region 824. Following this, mask 826 is removed.

Figure 8D:
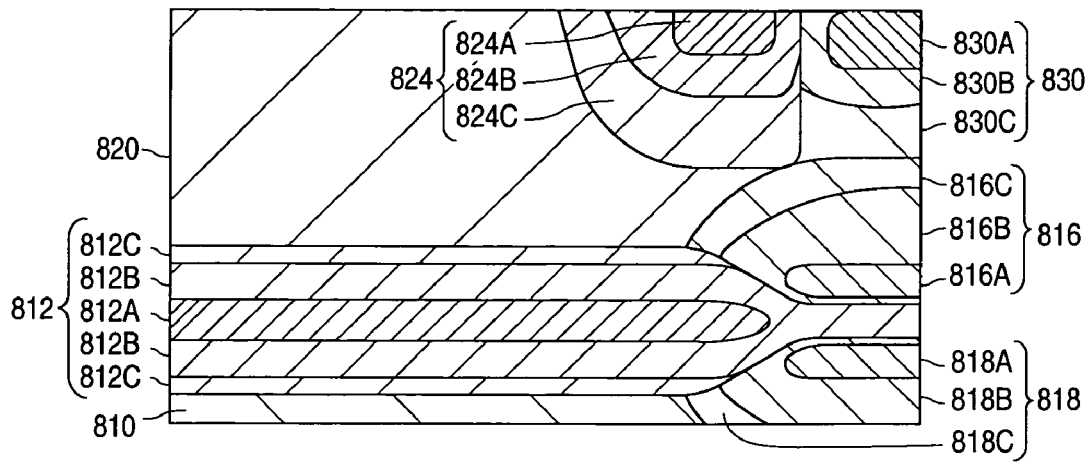

Next, as shown in FIG. 8D, wafer 800 is annealed which, in turn, causes the dopants in n+ sinker down region 824 to diffuse and form a center region 824A, a first outer region 824B that adjoins center region 824A, and a second outer region 824C that adjoins first outer region 824B.

Center region 824A has the first dopant concentration, while first outer region 824B has the second dopant concentration. Second outer region 824C has the third dopant concentration, while epitaxial layer 820 has the fourth dopant concentration. The first and second outer regions 824B and 824C represent the diffusion tails of center region 824A.

The annealing step also causes dopants in p+ sinker down region 830 to diffuse and contact region 816. In addition, the diffusion causes p+ sinker down region 830 to form a center region 830A, a first outer region 830B that adjoins center region 830A, and a second outer region 830C that adjoins first outer region 830B.

Center region 830A has the fifth dopant concentration, while first outer region 830B has the sixth dopant concentration. Second outer region 830C has the seventh dopant concentration, while substrate 810 has the eighth dopant concentration. The first and second outer regions 830B and 830C represent the diffusion tails of center region 830A.

Figure 8E:
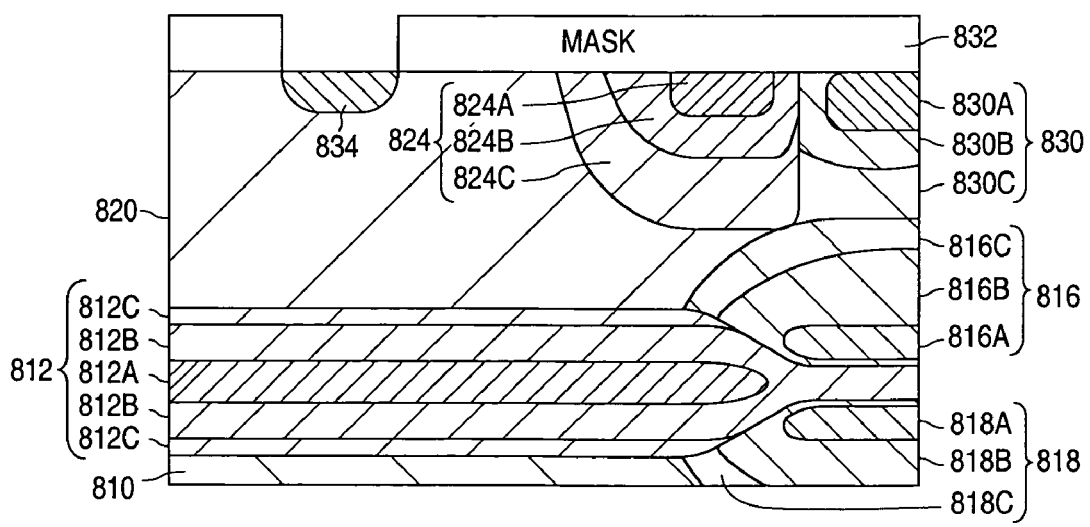

Following the annealing step, as shown in FIG. 8E, an implant mask 832 is formed and patterned on the top surface of epitaxial layer 820. Once mask 832 has been formed, the exposed regions of epitaxial layer 820 are implanted with a p-type dopant to form a p+ region 834. Following this, mask 832 is removed.

Figure 8F:
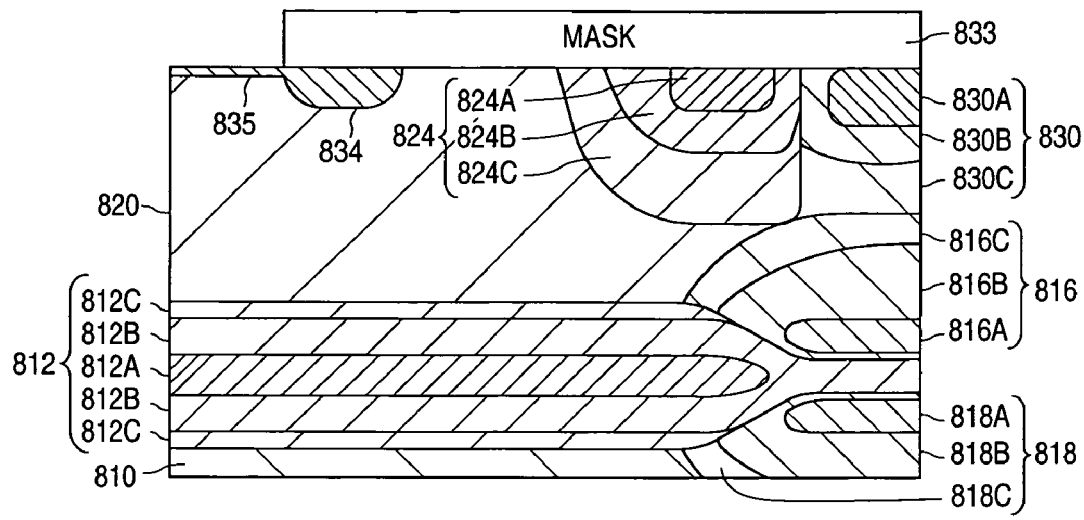

After mask 832 has been removed, as shown in FIG. 8F, an implant mask 833 is formed and patterned on the top surface of epitaxial layer 820. Once mask 833 has been formed, the exposed regions of epitaxial layer 820 are implanted with a p-type dopant to form a p+ region 835. Region 835 is formed to be shallower than region 834. Following this, mask 833 is removed.

Figure 8G:
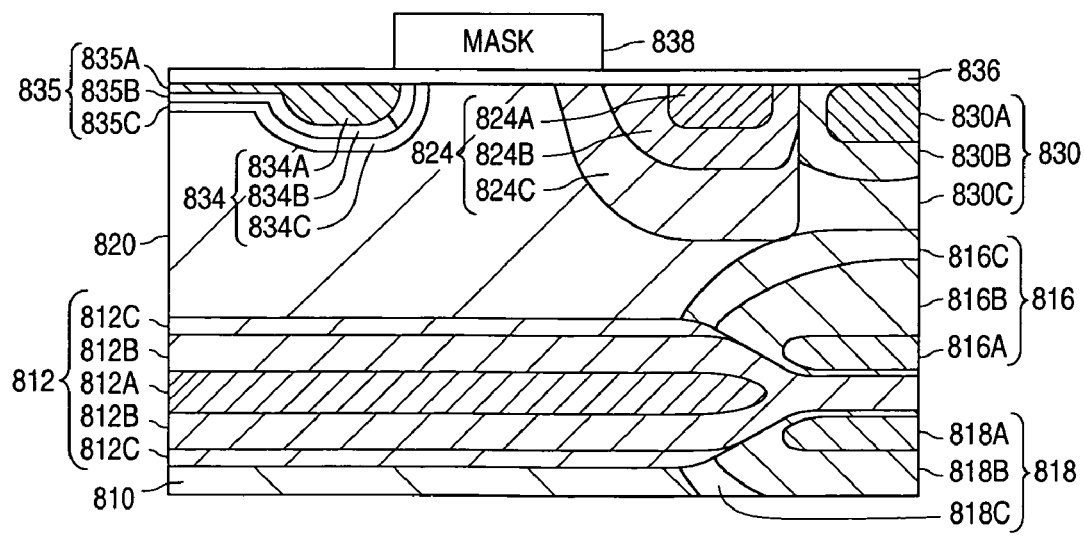

As shown in FIG. 8G, the method continues by forming a layer of oxide 836 on the top surface of epitaxial layer 820, followed by the formation and patterning of an oxide mask 838. As further shown in FIG. 8G, the thermal cycle associated with the formation of oxide layer 836 (or a later thermal cycle), causes p+ region 834 to diffuse and form a center region 834A, a first outer region 834B that adjoins center region 834A, and a second outer region 834C that adjoins first outer region 834B.

Center region 834A has the fifth dopant concentration, while first outer region 834B has the sixth dopant concentration, and second outer region 834C has the seventh dopant concentration. The first and second outer regions 834B and 834C represent the diffusion tails of center region 834A.

The thermal cycles also cause p+ region 835 to diffuse and form a center region 835A, a first outer region 835B that adjoins center region 835A, and a second outer region 835C that adjoins first outer region 835B. Center region 835A has the fifth dopant concentration, while first outer region 835B has the sixth dopant concentration, and second outer region 835C has the seventh dopant concentration. The first and second outer regions 835B and 835C represent the diffusion tails of center region 835A.

Once oxide mask 838 has been formed and patterned, the exposed areas of oxide layer 836 are then etched until the top surface of epitaxial layer 820 is exposed over p-type regions 834 and 835 and sinker down regions 824 and 830. Oxide mask 838 is then removed.

Figure 8H:
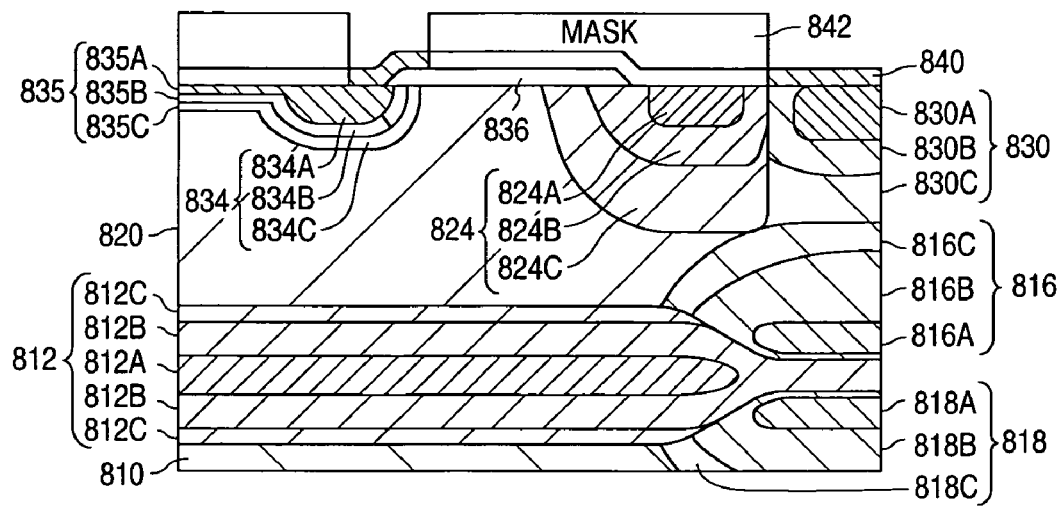

Next, as shown in FIG. 8H, a layer of polysilicon 840 is formed on epitaxial layer 820 and oxide layer 836, followed by the formation and patterning of a p-type implant mask 842 on polysilicon layer 840. After this, the regions of polysilicon layer 840 that are exposed by mask 842 are implanted to form p+ polysilicon regions. Mask 842 is then removed.

Figure 8I:
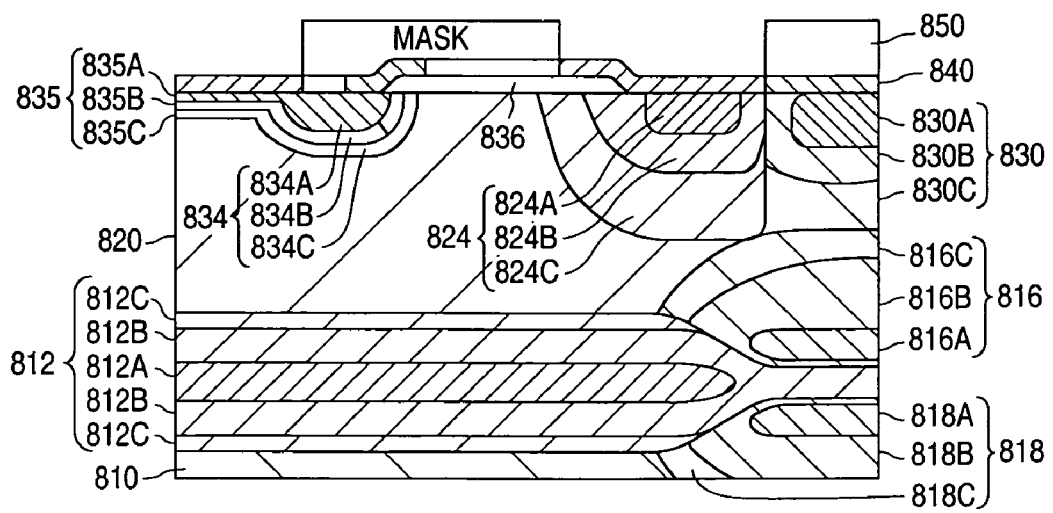

As shown in FIG. 8I, after mask 842 has been removed, an n-type implant mask 850 is formed and patterned on polysilicon layer 840. After this, the regions of polysilicon layer 840 that are exposed by mask 850 are implanted to form n+ polysilicon regions. Mask 850 is then removed.

Figure 8J:
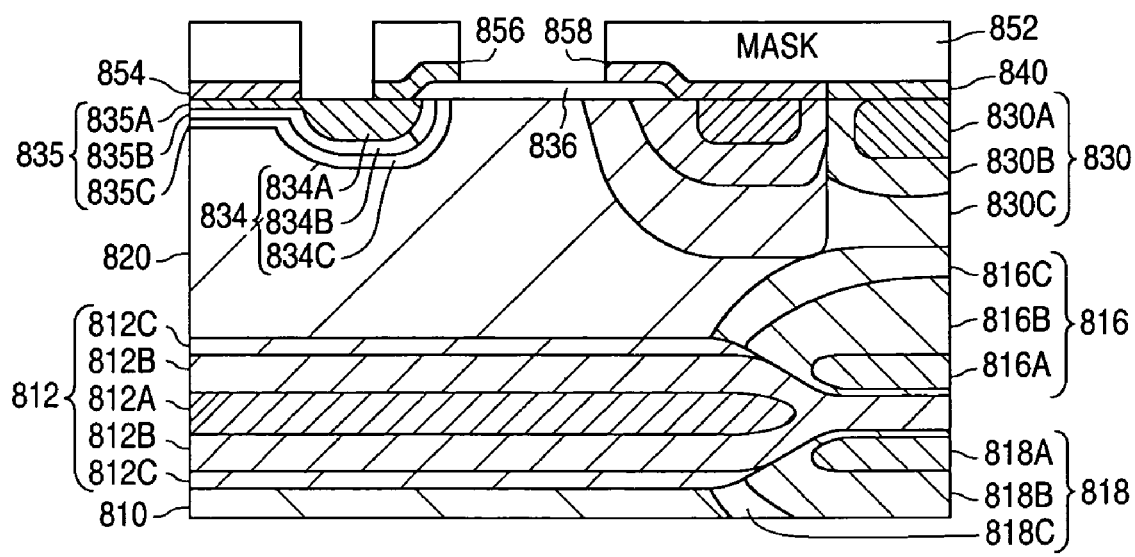

Following this, as shown in FIG. 8J, a poly mask 852 is formed and patterned on polysilicon layer 840. The regions of polysilicon layer 840 that are exposed by mask 852 are then etched to form a poly region 854, such as poly region 138, a poly region 856, such as poly region 136, and a poly region 858, such as poly region 134. Mask 852 is then removed, and the process continues with the conventional steps of forming an isolation layer over poly regions 854, 856, and 858, and forming contacts through the isolation layer to make electrical connections with poly regions 854, 856, and 858. (N+ polysilicon region 854 autodopes the underlying region to a degree in response to the thermal steps that follow the implant that forms region 854.)

When an SCR structure of the opposite conductivity is fabricated, (p-type) buried layer 812 and (n-type) regions 816 and 818 are formed by masking and implanting epitaxial layer 820. In addition, epitaxial layer 820 is implanted with a p-type dopant to form a p-well that lies above and contacts (p-type) buried layer 812 and (n-type) region 816. Region 834 and the succeeding regions are then formed as described above except that the conductivity types are reversed.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a silicon controlled rectifier on a wafer having a buried layer of a first conductivity type, a first region of a second conductivity type that touches the buried layer, and a second region of the first conductivity type that touches the buried layer and the first region, the method comprising:

forming a third region of the second conductivity type that touches the second region;

forming a fourth region of the first conductivity type that touches the second region, the fourth region being spaced apart from the buried layer, and lying vertically over the buried layer; and heating the wafer to cause the third region to diffuse and touch the first region.

2. The method of claim 1 wherein the first region lies above the buried layer.

3. The method of claim 2 wherein the first region is isolated from a substrate by the buried layer.

4. The method of claim 1 wherein the third region touches the fourth region.

5. The method of claim 1 and further comprising forming a fifth region of the second conductivity type that touches the second region, the fifth region being spaced apart from the third region and the fourth region.

6. The method of claim 5 and further comprising forming an isolation layer to touch a top surface of the second region, the isolation layer lying over an area of the second region that lies between the fourth region and the fifth region.

7. The method of claim 6 and further comprising forming a layer of polysilicon to touch the isolation layer and the third, fourth, and fifth regions, the layer of polysilicon being spaced apart form the second region.

8. A method of forming a silicon controlled rectifier comprising:

forming a semiconductor region, the semiconductor region having:
a buried layer having a first conductivity type and a dopant concentration;
a first region having a second conductivity type and a dopant concentration, the first region contacting the buried layer; and
a second region of the first conductivity type that contacts the buried layer and the first region;
forming a third region of the second conductivity type in the second region, the third region contacting the first region; and
forming a fourth region of the first conductivity type in the second region, the fourth region being spaced apart from the buried layer, and lying vertically over the buried layer.

9. The method of claim 8 wherein the third region contacts the fourth region.

10. The method of claim 9 and further comprising forming a fifth region of the second conductivity type in the second region, the fifth region being spaced apart from the third and fourth regions.

11. The method of claim 10 wherein the fourth region lies between the third region and the fifth region.

12. The method of claim 11 and further comprising:
forming an insulation region on the semiconductor region;
forming a conductive layer on the semiconductor region and the insulation region, the conductive layer contacting the third, fourth, and fifth regions; and
removing the conductive layer from a portion of the insulation region and a portion of the semiconductor region to form a conductive first layer that contacts the third and fourth regions, a conductive second layer that contacts the fifth region, and a conductive third layer that contacts the fifth region, the conductive first layer, the conductive second layer, and the conductive third layer being spaced apart.

13. The method of claim 12 wherein:
the conductive first layer includes a region of the first conductivity type that contacts the fourth region and a region of the second conductivity type that contacts the third region;
the conductive second layer has the second conductivity type; and
the conductive third layer has the first conductivity type.

14. The method of claim 13 wherein the fifth region has a deep section that contacts the conductive second layer and a shallow section that contacts the conductive third layer.

15. A method of forming a silicon controlled rectifier on a wafer, the method comprising:

forming a first region of a first conductivity type that touches a second region of a second conductivity type, the second region touching a buried layer of the second conductivity type and a third region of the first conductivity type, the third region touching the buried layer;

forming a fourth region of the second conductivity type that touches the second region, the fourth region being spaced apart from the buried layer, and lying vertically over the buried layer; and heating the wafer to cause the first region and the third region to diffuse and touch each other.

16. The method of claim 15 wherein the first region touches the fourth region.

17. The method of claim 15 and further comprising forming a fifth region of the first conductivity type that touches the second region, the fifth region being spaced apart from the first region and the fourth region.

18. The method of claim 17 and further comprising forming an isolation layer to touch a top surface of the second region, the isolation layer lying over an area of the second region that lies between the fourth region and the fifth region.

19. The method of claim 18 and further comprising forming a layer of polysilicon to touch the isolation layer and the first, fourth, and fifth regions, the layer of polysilicon being spaced apart from the second region.

20. The method of claim 19 and further comprising etching the layer of polysilicon to form a first polysilicon region that touches and lies over the first region and the fourth region, and a second polysilicon region that touches and lies over the fifth region.

* * * * *